United States Patent
Koep et al.

(10) Patent No.: US 9,801,285 B2
(45) Date of Patent: Oct. 24, 2017

(54) SOLDER PREFORMS AND SOLDER ALLOY ASSEMBLY METHODS

(71) Applicant: Alpha Assembly Solutions Inc., Waterbury, CT (US)

(72) Inventors: Paul Joseph Koep, Madison, NJ (US); Ellen S. Tormey, Princeton Junction, NJ (US); Girard Sidone, Bordentown, NJ (US)

(*) Notice: Subject to any disclaimer, the term of this patent is extended or adjusted under 35 U.S.C. 154(b) by 362 days.

(21) Appl. No.: 14/386,601

(22) PCT Filed: Mar. 15, 2013

(86) PCT No.: PCT/US2013/032137
§ 371 (c)(1),
(2) Date: Sep. 19, 2014

(87) PCT Pub. No.: WO2013/142335
PCT Pub. Date: Sep. 26, 2013

(65) Prior Publication Data
US 2015/0078810 A1    Mar. 19, 2015

Related U.S. Application Data

(60) Provisional application No. 61/613,233, filed on Mar. 20, 2012.

(51) Int. Cl.
| | |
|---|---|
| *B23K 31/02* | (2006.01) |
| *H05K 3/34* | (2006.01) |
| *B23K 35/26* | (2006.01) |
| *B23K 35/02* | (2006.01) |
| *B23K 1/00* | (2006.01) |
| *B23K 1/20* | (2006.01) |
| *B23K 101/42* | (2006.01) |

(52) U.S. Cl.
CPC ............ *H05K 3/34* (2013.01); *B23K 1/0016* (2013.01); *B23K 1/20* (2013.01); *B23K 35/025* (2013.01); *B23K 35/26* (2013.01); *B23K 35/262* (2013.01); *B23K 35/264* (2013.01); *H05K 3/3457* (2013.01); *H05K 3/3484* (2013.01); *B23K 2201/42* (2013.01); *Y10T 403/479* (2015.01)

(58) Field of Classification Search
CPC ...... H05K 3/34; H05K 3/3457; H05K 3/3484; B23K 1/0016; B23K 1/20; B23K 35/264; B23K 35/262; B23K 35/26; B23K 2201/36–2201/42; B23K 35/0244–35/025; Y10T 403/479
USPC ....... 228/245–255, 56.3, 179.1–180.22, 119, 228/264
See application file for complete search history.

(56) References Cited

U.S. PATENT DOCUMENTS

| | | | | |
|---|---|---|---|---|
| 4,878,611 A * | 11/1989 | LoVasco | ............... | H05K 3/303 228/180.22 |
| 5,427,865 A | 6/1995 | Mullen, III et al. | | |
| 5,551,627 A | 9/1996 | Leicht et al. | | |
| 5,569,433 A | 10/1996 | Chen et al. | | |
| 5,803,340 A * | 9/1998 | Yeh | ...................... | B23K 35/025 228/180.22 |
| 6,010,060 A | 1/2000 | Sarkhel et al. | | |
| 6,117,759 A * | 9/2000 | Greer | .................. | H01L 21/4853 228/180.22 |
| 6,330,967 B1 * | 12/2001 | Milewski | ............... | B23K 31/02 228/180.22 |
| 6,648,210 B1 * | 11/2003 | Steen | ................... | B23K 35/025 148/24 |
| 7,560,373 B1 * | 7/2009 | Hua | ...................... | H05K 3/3463 257/E21.508 |
| 2001/0002982 A1 | 6/2001 | Sarkhel et al. | | |
| 2001/0005314 A1 | 6/2001 | Farooq et al. | | |
| 2003/0134233 A1 * | 7/2003 | Su | ........................... | H01L 24/11 430/318 |
| 2003/0156969 A1 * | 8/2003 | Choi | ..................... | B23K 35/262 420/560 |
| 2003/0219987 A1 * | 11/2003 | Wang | ...................... | H01L 24/11 438/720 |
| 2004/0177997 A1 * | 9/2004 | Hata | .................... | H05K 3/3484 174/257 |
| 2005/0092814 A1 * | 5/2005 | Waldvogel | ............. | H05K 1/021 228/180.1 |
| 2005/0224560 A1 * | 10/2005 | Takesue | ............... | B23K 1/0016 228/180.22 |
| 2006/0022320 A1 * | 2/2006 | Nakanishi | ........... | H01L 23/3114 257/678 |
| 2006/0054657 A1 * | 3/2006 | Francis | .................. | B23K 1/018 228/19 |

(Continued)

FOREIGN PATENT DOCUMENTS

| | | | |
|---|---|---|---|
| EM | EP0711629 A1 | | 5/1996 |
| GB | 2293564 B | | 12/1998 |
| WO | 9427777 A1 | | 12/1994 |
| WO | WO 2009/150759 A1 * | | 12/2009 |

*Primary Examiner* — Kiley Stoner

(74) *Attorney, Agent, or Firm* — Carmody Torrance Sandak & Hennessey, LLP

(57) ABSTRACT

A method of assembling components, such as electronic components, onto a substrate, such as an electronic substrate, includes applying solder paste to an electronic substrate to form a solder paste deposit, placing a low temperature preform in the solder paste deposit, processing the electronic substrate at a reflow temperature of the solder paste to create a low temperature solder joint, and processing the low temperature solder joint at a reflow temperature that is lower than the reflow temperature of the solder paste. Other methods of assembling components and solder joint compositions are further disclosed.

8 Claims, No Drawings

(56) References Cited

U.S. PATENT DOCUMENTS

| | | |
|---|---|---|
| 2006/0091188 A1 | 5/2006 | Tay et al. |
| 2006/0180639 A1* | 8/2006 | Goudarzi ............. B23K 1/0016 228/226 |
| 2007/0012751 A1* | 1/2007 | Waldvogel ........... B23K 1/0016 228/256 |
| 2007/0096339 A1* | 5/2007 | Tanaka .............. H01L 23/49811 257/780 |
| 2008/0308612 A1 | 12/2008 | Wettermann et al. |
| 2009/0136824 A1* | 5/2009 | Takagi ................ H01M 8/0208 429/437 |
| 2010/0105173 A1* | 4/2010 | Fujimori ................ H01L 24/11 438/121 |
| 2011/0068151 A1* | 3/2011 | Oh ....................... B23K 1/0016 228/119 |
| 2012/0018048 A1* | 1/2012 | Yamashita ........... B23K 1/0016 148/24 |
| 2012/0055586 A1* | 3/2012 | McIsaac .............. B23K 1/0008 148/24 |
| 2012/0069528 A1* | 3/2012 | Bindrup ............. B23K 1/0016 361/728 |
| 2012/0299202 A1* | 11/2012 | Yamaguchi ........... H01L 23/315 257/779 |
| 2013/0088839 A1* | 4/2013 | Yamakami ............... H05K 3/00 361/728 |
| 2014/0158423 A1* | 6/2014 | Anderson ............ B23K 35/001 174/94 R |
| 2015/0258636 A1* | 9/2015 | Snugovsky .......... B23K 35/264 148/24 |
| 2016/0128196 A1* | 5/2016 | Yasui ................... B23K 35/262 361/760 |
| 2016/0234945 A1* | 8/2016 | Nagata ................... B23K 35/26 |

* cited by examiner

SOLDER PREFORMS AND SOLDER ALLOY ASSEMBLY METHODS

CROSS-REFERENCE TO RELATED APPLICATIONS

This application is a U.S. National Stage Application under 35 U.S.C. §371 of PCT Application Serial No. PCT/US2013/032137 filed on Mar. 15, 2013, which claims the benefit of priority to U.S. Provisional Patent Application Ser. No. 61/613,233 filed on Mar. 20, 2012, the entire disclosures of which are hereby incorporated herein by reference in their entireties for all purposes.

BACKGROUND OF THE DISCLOSURE

The present disclosure is directed to methods of attaching components onto substrates, and more particularly to methods of attaching electronic components and associated devices onto printed circuit boards.

Lead free solder alloys are well known in the art of circuit board assembly. Examples of such lead free solder alloys are tin-silver-copper or SAC alloys and tin and bismuth alloys. SAC alloys suffer from a disadvantage of having relatively higher processing temperatures. Tin-Bismuth alloys exhibit loss of ductility at high strain rates.

SUMMARY OF THE DISCLOSURE

One aspect of the disclosure is directed to a method of assembling components, such as electronic components, onto a substrate, such as an electronic substrate. In one embodiment, the method comprises: applying solder paste to an electronic substrate to form a solder paste deposit; placing a low temperature preform in the solder paste deposit; processing the electronic substrate at a reflow temperature of the solder paste to create a low temperature solder joint; and processing the low temperature solder joint at a reflow temperature that is lower than the reflow temperature of the solder paste.

Embodiments of the method further include a second solder process at a temperature between the lower reflow temperature and the reflow temperature. In certain embodiments, the low temperature preform may be a composition consisting of tin and bismuth. The composition may consist of 42% by weight tin and 58% by weight bismuth. The composition further may consist of silver. In certain other embodiments, the solder joint consists of tin, silver, copper, and bismuth. The solder joint may consist of 49-53% by weight tin, 0-1.0% by weight silver, 0-0.1% by weight copper, and 46-50% by weight bismuth. The reflow temperature of the solder joint may be between 138-170° C. In certain other embodiments, the composition may consist of 55% by weight tin and 45% by weight bismuth.

Another aspect of the disclosure is directed to a method comprising: applying low temperature solder paste to an electronic substrate to form a solder paste deposit; placing a high temperature preform in the solder paste deposit; and processing the electronic substrate at a reflow temperature that is appropriate for the low temperature solder paste to create a low temperature solder joint resulting from a dissolution of the high temperature solder preform into the low temperature solder paste deposit.

Embodiments of the method further include a low temperature solder paste composition consisting of tin and bismuth. In certain embodiments, the composition may consist of 42% by weight tin and 58% by weight bismuth. The composition further may consist of silver. The reflow temperature of the solder joint may be between 190-200° C.

Another aspect of the disclosure is directed to a solder joint comprising 49-53% by weight tin, 0-1.0% by weight silver, 0-0.1% by weight copper, and balance bismuth. In one embodiment, the reflow temperature of the solder joint is between 190-200° C.

DETAILED DESCRIPTION OF THE PREFERRED EMBODIMENTS

In accordance with one or more embodiments, two or more types of solder joints that reflow at different temperatures may be created on the same side of a printed circuit board (PCB) using a single solder paste print process by selectively placing low temperature preforms in solder paste deposits. After reflow at the temperature of the solder paste alloy, joints can be reflowed in a second solder process or reworked at a lower temperature, without disturbing the majority of the other solder joint connections.

In accordance with one or more specific non-limiting embodiments, tin-bismuth preforms having a melt temperature of about 138° C. are placed in deposits of SAC (tin-silver-copper) solder paste having a melt temperature of about 217° C. to create a low temperature solder joint having a melt temperature of about 165-180° C. The resulting solder joint is suitable for a low temperature second solder process at about 200° C., thus enabling the second solder process without disturbing the SAC solder joints. The second solder process may involve, for example, attachment of an RF shield or temperature sensitive components and may occur at a temperature higher than the low temperature solder (about 200° C. for example) but below the melting temperature of SAC solder which is approximately 217° C. Different preforms may be selectively used to create regions that reflow at different temperatures.

In accordance with one or more embodiments, a portion of one side of a PCB may be selectively created with low temperature solder coexisting with standard lead free SAC solder. A second soldering operation can then be performed on the PCB (solder a radio frequency or RF shield, for example) after electrical verification testing, without disturbing the SAC solder joints. Methods and approaches in accordance with one or more embodiments beneficially do not require any sophisticated assembly operation, such as dispensing low temperature solder paste which is inefficient, to create a second, low temperature region on the PCB. Low temperature solder joints are instead created by printing just one type of solder paste (for example SAC305) and then by selective pick and place of low temperature preforms (for example Sn42Bi58) into the SAC paste, and reflowing the board at SAC temperatures (for example about 240° C.). Thus, a region of the board contains low temperature solder (for example Sn55Bi45 or Sn60Bi40), which can be used in a second solder process at a reflow temperature that does not disturb the SAC solder joints (for example reflow at 200° C.).

Methods in accordance with one or more embodiments may be used in various applications. In some non-limiting embodiments, a mobile handset assembler may perform a 100% test the electronics on a PCB, then attach the RF shields. Applying the low temperature solder paste for the shields after the components are already attached would require dispensing, which is cumbersome and slow. If the RF shields are attached with SAC solder paste only, the second solder process would disturb the already tested electrical components. A more efficient method is to build the low temperature solder joints from SAC solder paste and tin-bismuth preforms, and reflow the combination during the initial reflow. Once electrical testing is complete, the shield may be attached by dipping it into flux paste, placing it on the existing low temperature solder joints, and reflowing at a temperature sufficient to reflow the low temperature solder, but below the temperature of SAC.

In other non-limiting embodiments, an RF shield may be soldered onto the board at the same time as the other SAC components, but since the solder joints securing the shield are soldered using a combination of SAC solder paste and tin-bismuth preforms, the shield can be removed without disturbing the other solder joints since the reflow temperature of the shield solder joints is lower than the other components on the board. If the shields are attached using SAC solder, the removal process of the shield (to access or rework electrical issues with integrated circuits under the shield) may disturb the surrounding area solder joints, potentially introducing more problems while attempting to fix a specific issue under the RF shield.

In further non-limiting embodiments, attaching temperature sensitive components to the PCB can be accomplished by creating their solder joints with SAC solder paste and tin-bismuth preforms. The temperature sensitive components are then attached with the aid of only paste flux, and at a lower temperature soldering operation. The paste flux acts to anchor the parts in position, much like solder paste anchors electrical components during standard PCB assembly.

In still other embodiments, thermal cycling endurance and resistance to drop shock, two product features that are important to electronic assemblies, are optimized. The solder alloy plays a key role in the performance of the assembly for both of these metrics. To optimize specifically for thermal cycling endurance, the solder alloy would typically contain a small percentage of silver. However, to optimize for drop shock, less silver is preferred. With the ability to blend alloys on a single PCB, all with a single solder paste application method, it is possible to fine tune for both drop shock and thermal cycling endurance by selectively engineering the solder alloy for specific devices on the same board.

In accordance with one or more embodiments, methods may create RoHS (Restriction on Hazardous Substances) compliant low temperature alloy selectively on a PCB coincident with SAC305 solder. Such methods may involve a single solder paste print process using standard equipment. In some non-limiting embodiments, an RF shield may be removed for rework without disturbing surrounding components. In other embodiments, low temperature solder joints may be formed during SAC305 reflow which may be used to support a second reflow process at low temperature. The second process may, for example, attach temperature sensitive components or attach an RF shield.

In accordance with one or more embodiments, a method for creating low temperature solder alloy for shield attach may involve a single solder paste print process. In some embodiments, SAC305 solder paste may be printed. A tin-bismuth alloy preform may be placed in the solder paste on pads that connect RF shields. The assembly may then be reflowed using a standard SAC305 reflow profile. The RF shield may be removed at lower temperature, without disturbing the SAC305 solder joints. SAC305 solder paste and tin-bismuth preforms may be combined in various ratios to achieve desired non-eutectic tin-bismuth-silver-copper alloy. The preform alloy can be tuned to achieve more alloy flexibility. Reflow in nitrogen may provide increased flexibility for preform-paste ratios.

In a first example of alloys:

| | Alloy Composition | Blend | Contribution | Combined Alloy |
|---|---|---|---|---|
| PASTE | | 1.0 | | |
| Sn | 96.5 | | 19.3 | 52.9 Sn |
| Ag | 3.0 | | 0.6 | 0.9 Ag |
| Cu | 0.5 | | 0.1 | 0.1 Cu |
| PREFORM | | 4.0 | | |
| Sn | 42.0 | | 33.6 | |
| Bi | 57.6 | | 46.1 | 46.1 Bi |
| Ag | 0.4 | | 0.32 | |
| TOTAL | 100.0 | | 100.0 | |

The composition comprises one part SAC305 solder paste added to four parts SnBi47.6Ag0.04 preform=~Sn53 Bi Ag1 Cu 0.1. (Melt range of about 138-165° C.)

In a second example of alloys:

| | Alloy Composition | Blend | Contribution | Combined Alloy |
|---|---|---|---|---|
| PASTE | | 1.0 | | |
| Sn | 96.5 | | 13.8 | 49.8 Sn |
| Ag | 3.0 | | 0.4 | 0.4 Ag |
| Cu | 0.5 | | 0.1 | 0.07 Cu |
| PREFORM | | 6.0 | | |
| Sn | 42.0 | | 36.0 | |
| Bi | 58.0 | | 49.7 | 49.7 Bi |
| Ag | 0.0 | | 0.0 | |
| TOTAL | 100.0 | | 100.0 | |

The composition comprises one part SAC305 solder paste added to six parts Sn42Bi58 preform=~Sn50 Bi50Ag0.4 Cu. (Melt range of about 138-170° C.)

Thus, both examples of alloys presented above may be reworked at significantly below 200° C.

Preforms can be fabricated in a wide variety of alloys which may enable the fine tuning of the combined alloy in accordance with one or more embodiments. For example, in some non-limiting embodiments, Sn55Bi45+Cu Co may enhance drop shock. Sensitivity to high silver is not critical in non-eutectic alloys. By using preforms to selectively tune solder joint alloys for particular locations on a PCB, it is possible to meet a mixture of goals for a single assembly. In some embodiments drop shock or thermal cycling sensitivity of a particular component may be overcome by altering the alloy for that particular component.

In another embodiment of the disclosure, a method of producing solder joints may employ applying a low temperature solder paste, such as a tin-bismuth alloy (e.g., SN42BI58), to a printed circuit board ("PCB") to form solder deposits, and selectively placing higher temperature preforms, such as SAC305 preforms, in the solder paste deposits. The resulting combination is processed at a reflow temperature that is appropriate for the low temperature solder paste to create a low temperature solder joint. Essentially, the high temperature solder preforms dissolve or otherwise blend into the low temperature solder paste. The reflow temperature of the resulting solder joint is between 190-200° C. In certain embodiments, preforms having a higher processing temperature may be employed while still maintaining a lower overall processing temperature. With this embodiment, the higher temperature preform dissolves into the lower temperature solder paste deposit. Thus, the processing temperature does not need to reach the melting temperature of the preform to achieve the resulting solder joint. The foregoing method may be suitable in situations requiring a low temperature reflow process or when the resulting solder joint has unique features, such as higher tin content to improve ductility of the solder joint.

In one example, method includes depositing SN42BI58 solder paste on a printed circuit board. Solder preforms, such as SAC305 solder preforms, are selectively placed onto solder paste deposits. The resulting system is processed at a temperature between 190-200° C., which is appropriate to reflow the SN42BI58 solder paste deposits. The resulting solder joints have a high tin content, and thus a different, unique alloy, having unique properties.

As used herein, reflow soldering refers to a process in which solder paste is printed or dispensed, or a solder preform is placed, or both, on a surface of a printed circuit board, components are placed in or near the deposited solder, and the assembly is heated to a temperature sufficient to reflow the solder.

In a certain embodiment, the solder paste and the preform share at least one common element to facilitate a quick dissolution of one alloy into the other at temperatures close to or below the melting point of one of the alloys. In one embodiment, the common element is tin.

In certain embodiments, the solder paste, includes the compositions described herein that are combined with a flux. Suitable fluxes are known in the art.

The methods and compositions described herein may be used in applications including, but not limited to, printed circuit board fabrication, LED assembly, photovoltaic cell fabrication, semiconductor fabrication, and die attachment.

It is to be appreciated that embodiments of the methods discussed herein are not limited in application to the details of construction and the arrangement set forth herein. The methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A method of assembly, comprising:
   applying SAC solder paste to an electronic substrate to form a solder paste deposit;
   placing a low temperature preform in the SAC solder paste deposit, wherein the low temperature preform has a melting temperature below the melting temperature of the SAC solder paste;
   processing the electronic substrate at a reflow temperature of the SAC solder paste to create a low temperature solder joint; and
   processing the low temperature solder joint at a reflow temperature that is lower than the reflow temperature of the SAC solder paste;
   wherein the reflow temperature of the low temperature solder joint is between 138-170° C.

2. The method of claim 1, wherein the low temperature preform is a composition consisting of tin and bismuth.

3. The method of claim 2, wherein the composition consists of 42% by weight tin and 58% by weight bismuth.

4. The method of claim 2, wherein the composition further consists of silver.

5. The method of claim 1, wherein the solder joint consists of tin, silver, copper, and bismuth.

6. The method of claim 5, wherein the solder joint consists of 49-53% by weight tin, 0-1.0% by weight silver, 0-0.1% by weight copper, and 46-50% by weight bismuth.

7. The method of claim 1, further comprising a second solder process at a temperature between the lower reflow temperature and the reflow temperature.

8. The method of claim 1, wherein the composition consists of 55% by weight tin and 45% by weight bismuth.

* * * * *